United States Patent [19]

Kulhavy

[11] Patent Number: 4,461,015

[45] Date of Patent: Jul. 17, 1984

[54] DIGITAL DEPTH INDICATOR FOR EARTH DRILLING APPARATUS

[76] Inventor: Joseph A. Kulhavy, P.O. Box 727, Sherman, Tex. 75090

[21] Appl. No.: 287,440

[22] Filed: Jul. 27, 1981

[51] Int. Cl.³ ............................................. G06F 11/32
[52] U.S. Cl. ...................................... 377/24; 377/17; 377/45; 377/52; 173/21; 175/45; 33/125 R
[58] Field of Search ....................... 377/17, 43, 44, 45, 377/24, 52, 21; 173/21; 175/40; 33/125 R

[56] References Cited

U.S. PATENT DOCUMENTS

| | | | |
|---|---|---|---|
| 2,655,633 | 10/1953 | Minor et al. | 377/24 |
| 3,558,104 | 1/1971 | McGinty | 33/125 R |
| 3,648,029 | 3/1972 | Ungnadner | 377/17 |
| 4,094,371 | 6/1978 | Ferrell | 377/17 |
| 4,339,946 | 7/1982 | Cole | 173/21 |

*Primary Examiner*—Joseph A. Orsino, Jr.
*Assistant Examiner*—Timothy K. Greer
*Attorney, Agent, or Firm*—Neal J. Mosely

[57] ABSTRACT

A digital depth indicator for rotary earth drills, and particularly auger type drills, operates from the means used to lower and raise the drill. The indicator operates from either the wire or cable of a wire line hoist auger or the hydraulic fluid flow in a hydraulic Kelly hoist type machine. A rotary measuring device is provided with an incremental shaft encoder which rotates to produce a dual signal which is supplied to (1) an up/down digital counter and (2) a programmable ÷N counter, which counter supplies a ÷N pulse to the up/down digital counter. The programmable ÷N counter is provided with switches for (1) setting the apparatus to read in feet or in meters and (2) setting the program for the drilling machine type or model. The output from the up/down digital counter is fed through a display driver to a digital display showing the indicated depth in feet or meters. In a wire line hoist auger, the rotary shaft encoder is operated by a rotary counter wheel which is rotated by movement of the wire line or cable lowering or raising the drill or auger. In hydraulic Kelly hoist type machines, the rotary shaft encoder is rotated by a hydraulic fixed displacement motor which measures the volume of hydraulic fluid supplied to the hydraulic cylinder of the Kelly hoist and registers as feet or meters of drill or auger movement.

9 Claims, 5 Drawing Figures

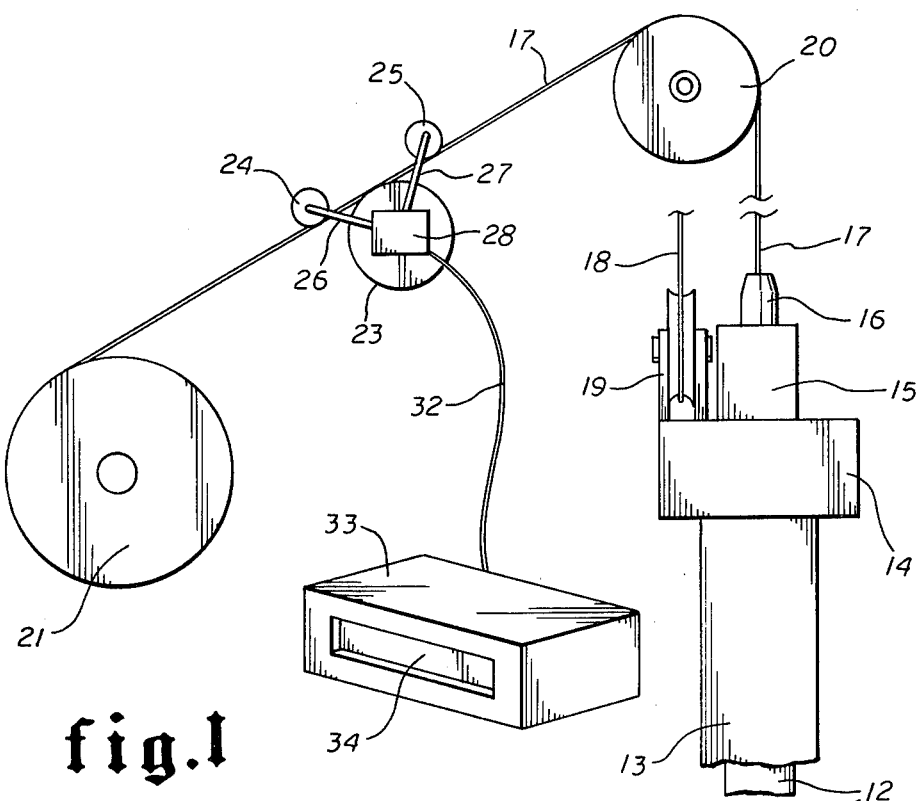
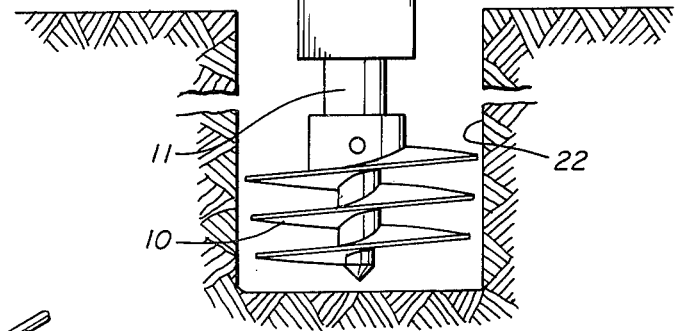
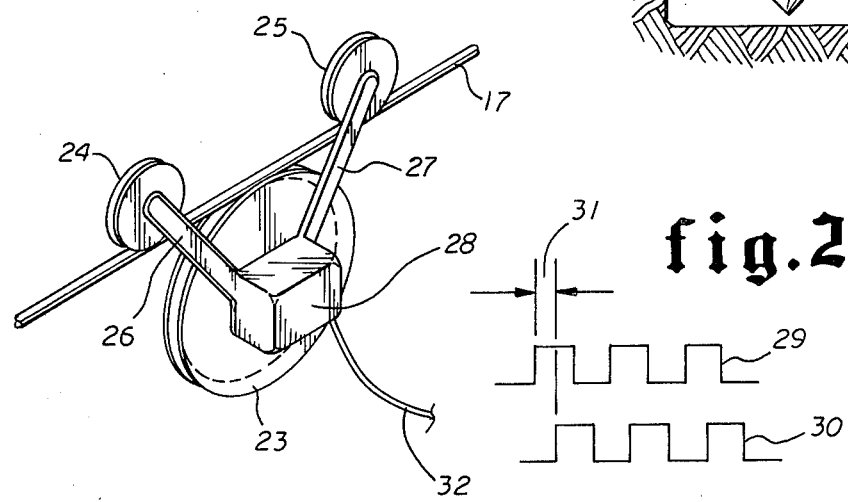
fig.1
fig.2

DIGITAL DEPTH INDICATOR FOR EARTH DRILLING APPARATUS

BACKGROUND OF THE INVENTION

1. Field of the Invention

This invention relates to new and useful improvements in depth indicating systems for earth drilling equipment and more particularly to digital depth indicators for rotary earth drills or augers.

2. Description of the Prior Art

Rotary earth drills that utilize augers as cutting tools are used to bore holes for a wide variety of purposes and generally to precise depths. The current method used to measure the depth of these holes is awkward and time consuming. A weight is fastened to the end of a steel tape which is lowered in the hole until slack is detected the depth is read off the tape at the edge of the hole obviously, the drilling process must stop while this is happening. Also, the operator has no method other than "feel" by which to monitor the hole depth continuously.

A number of techniques are known for registering the depth of well logging equipment in completed oil wells and the like.

Wyllie U.S. Pat. No. 3,332,483 discloses well logging equipment in which the position of a well logging tool is located by measuring rotation of a sheave.

Baldwin U.s. Pat. No. 3,509,764 discloses well logging equipment having electrical means for registering the depth of logging equipment.

Morris U.S. Pat. No. 3,603,145 discloses equipment for logging wells including means for registering the position of the logging equipment in the well.

Anderson U.S. Pat. No. 3,954,006 discloses well logging equipment including means for registering the position of the logging equipment in the well.

There is also known to measure the depth of drilling equipment from the rotation of drums from which cable is played to lower the drill.

Connors U.S. Pat. No. 2,573,640 discloses an auger type portable earth drill including mechanical indicating means based on rotation of a drum playing out cable.

Hayward U.S. Pat. No. 2,221,767 discloses an apparatus for measuring well depths and well strings which utilizes the rotation of a drum which plays out the cable lowering the drilling equipment and attempts to measure depth by rotation of the drum.

Arps U.S. Pat. No. 2,659,046 discloses a depth meter based on rotation of a mechanical indicating device by the drum which plays out the cable lowering the drilling equipment.

These patents disclose various means which are specially designed for use with the particular equipment and are not versatile to allow for adaptation to different types of drilling equipment including both cable hoist equipment and hydraulic Kelley hoist equipment. Also, these patents do not suggest any means for direct digital read out of depth from the movement of the cable or the hydraulic fluid as distinguished from the rotation of the lowering drum. The depth of a drill or a well log in a well is only approximately determined by the number of rotations of the cable drum. To get a precise measurement, it is necessary to take the measurement directly on the cable itself. This invention solves a number of problems of the prior art in that it is flexible and can be applied both to hydraulic Kelly hoist drilling equipment and cable hoist drilling equipment. In addition, it gives a direct digital read out based on the exact amount of movement of the means used for raising and lowering the drill or auger.

SUMMARY OF THE INVENTION

One of the objects of this invention is to provide a new and improved system of apparatus for displaying digitally the depth of a hole in the earth drilled by rotary earth drills, particularly auger type drills.

Another object of this invention is to provide a new and improved depth indicator for rotary earth drills which operates directly off the raising and lowering means for a rotary drill.

Another object of this invention is to provide a new and improved depth indicator for rotary earth drills which are operated by movement of the wire or cable of a wire line hoist drill or by the flow of hydraulic fluid in a hydraulic Kelly hoist drill.

Still another object of this invention is to provide a new and improved depth indicator for rotary earth drills utilizing a rotary incremental shaft encoder for producing a dual pulse signal based on the rotation of rotary indicator equipment associated with a wire line hoist or with the flow of hydraulic fluid in a hydraulic Kelly hoist drill, and converting said pulses to a digital display on an indicator dial in English or metric units.

Other objects of this invention will become apparent from time to time throughout the specification and claims as hereinafter related.

The above objects and other objects of this invention are accomplished by a digital depth indicator for rotary earth drills, and particularly auger type drills, which operate directly from the means used to lower and raise the drill. The indicator operates from either the wire or cable of a wire line hoist auger or the hydraulic fluid flow in a hydraulic Kelly hoist type machine. A rotary measuring device is provided with an incremental shaft encoder which rotates to produce a dual signal which is supplied to (1) an up/down digital counter and (2) a programmable ÷N counter, which counter supplies a ÷N pulse to the up/down digital counter.

The programmable ÷N counter is provided with switches for (1) setting the apparatus to read in feet or in meters and (2) setting the program for the drilling machine type or model. The output from the up/down digital counter is fed through a display driver to a digital display showing the indicated depth in feet or meters. In a wire line hoist auger, the rotary shaft encoder is operated by a rotary counter wheel which is rotated by movement of the wire line or cable lowering or raising the drill or auger. In hydraulic Kelly hoist type machines, the rotary shaft encoder is rotated by a hydraulic fixed displacement motor which measures the volume of hydraulic fluid supplied to the hydraulic cylinder of the Kelly hoist and registers as feet or meters of drill or auger movement.

BRIEF DESCRIPTION OF THE DRAWINGS

FIG. 1 is a schematic view of a wire line hoist type of rotary earth drilling auger having a depth indicator associated therewith representing a preferred embodiment of this invention.

FIG. 2 is an enlarged detail view, in isometric form, and having a pulse wave diagram associated therewith illustrating the production of dual pulse signals by the indicator mechanism of a preferred embodiment of the invention, substantially as shown in FIG. 1.

DESCRIPTION OF A PREFERRED EMBODIMENT

Figure 3:
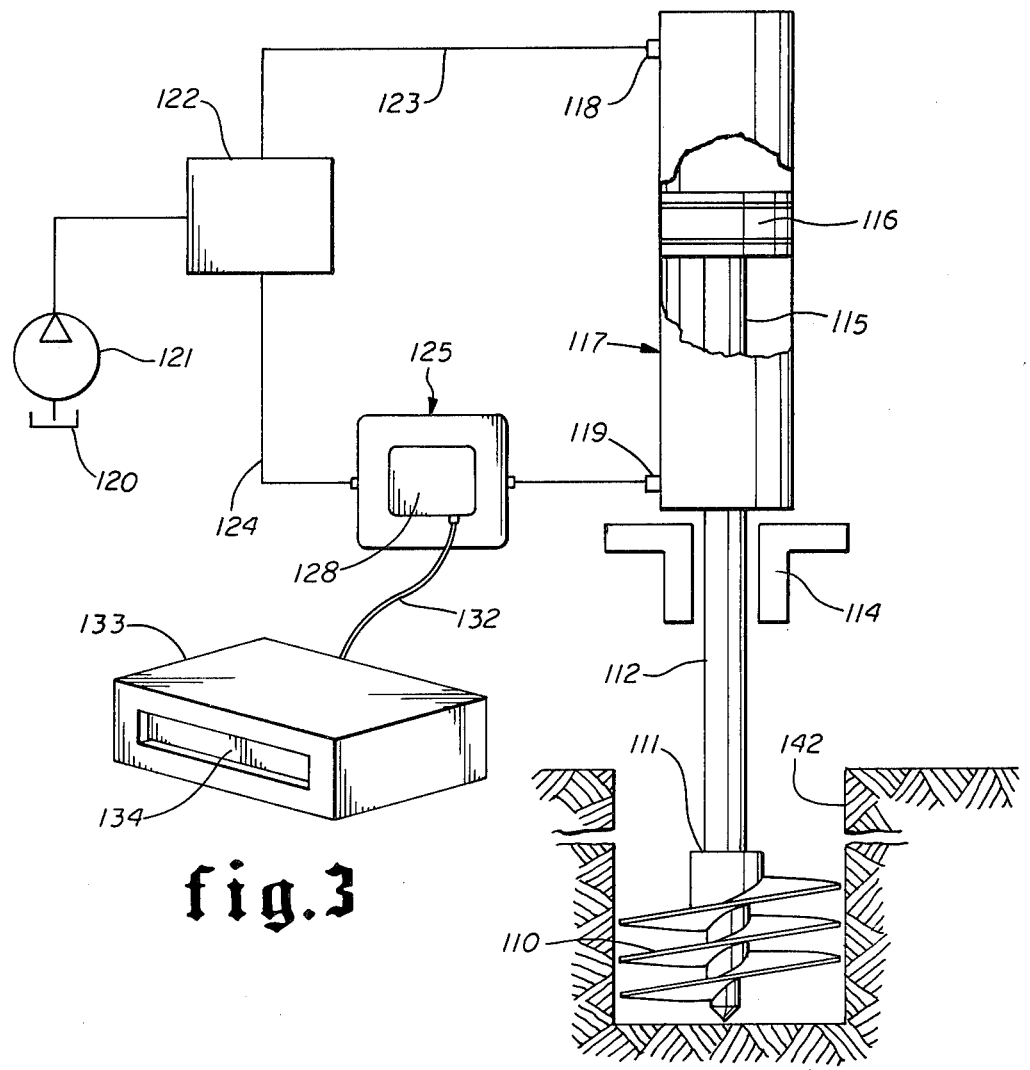
FIG. 3 is a schematic view of a hydraulic Kelly hoist type of earth drilling auger having a depth indicator apparatus associated therewith representing another preferred embodiment of this invention.

In FIGS. 1 and 2, there is shown an embodiment of the invention for indicating depth of holes drilled by a wire line type Kelly hoist machine. The drilling apparatus, which is shown schematically consists of a drilling auger 10 secured on the lower end 11 of an inner Kelly bar 12. Kelly bar 12 is telescoped inside over Kelly bar 13 which fits in outer Kelly swivel 14. At the upper end 15 of inner Kelly bar 12, there is provided an inner Kelly swivel 16 which is connected to hoist wire or cable 17. Outer Kelly swivel 14 is operated by a hoist line or cable 18 through pulley 19. Hoist line 17 is fed over mast crown sheave 20 and is wound on hoist drum 21. Rotation of hoist drum 21 is effective to raise or lower the inner Kelly bar which carries auger 10 at its lower end. The amount of cable 17 which is unwound from drum 21 corresponds exactly to the depth of the auger 10 in the hole 22 in the earth. The apparatus thus far described is more or less conventional in wire line Kelly hoist earth drilling auger machines.

In this embodiment of the invention, the depth indicator system is provided which operates in association with the means for raising and lowering the auger 10, i.e. the wire or cable 17. One portion of the depth indicator is the measuring mechanism which consists of counter wheel 23 which rolls on cable 17 and is secured by idler wheels 24 and 25 carried on supporting arms 26 and 27. The counter wheel and idler wheels are supported in a fixed position relative to cable 17 by suitable supporting means (not shown).

A rotatable shaft encoder 28 is supported on supporting arms 26 and 27 at the axis of rotation or axle for counter wheel 23. Counter wheel 23 therefore is rotated by movement of cable 17 and rotates the rotary member (not shown) of shaft encoder 28. Shaft encoder 28 is connected by suitable electrical connections (not shown) so that rotation of the encoder mechanism is effective to produce dual pulses 29 and 30 which are off set as indicated at 31. Dual pulses 29 and 30 are transmitted over electrical wires 32 to digital display unit 33 in the dial or display opening 34 in which the depth of hole 22 is registered in either English units (feet) or metric units (meters).

Figure 5:
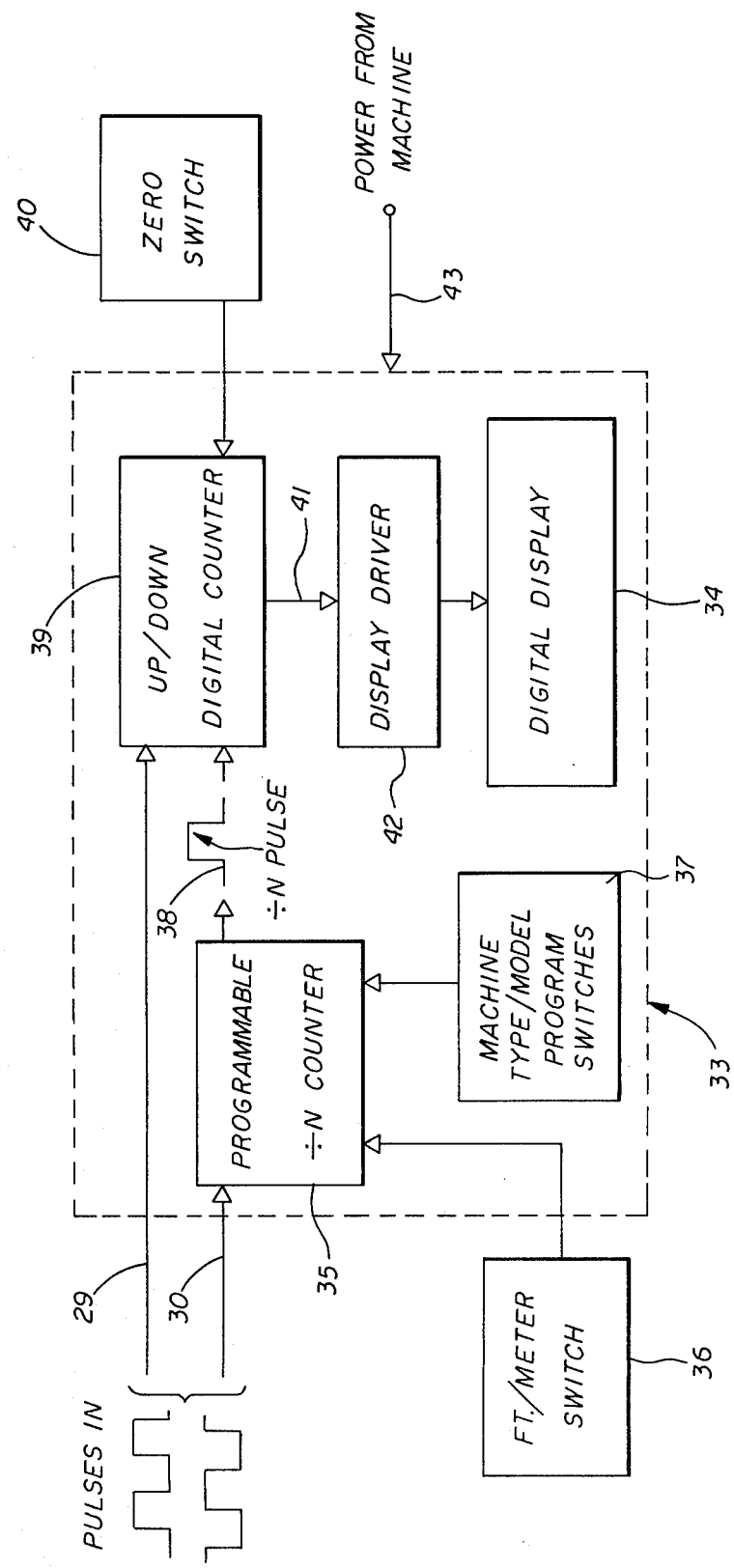
FIG. 5 is a schematic diagram of the electrical components of the indicator mechanism used in the embodiments shown in FIGS. 1 and 3.

In FIG. 5, there is shown a schematic diagram of the electrical components in digital display 33. Digital display apparatus 33 consists of a programmable ÷N counter 35 having switch 36 for setting the counter between English and metric units and switch 37 for setting the counter according to the type or model of equipment on which the depth indicator system is being used. Switches 36 and 37 adjust the programming of counter 35 to provide pulses which will be counted and measured in appropriate digital units and displayed on the display dial 34. The setting of switches 36 and 37 establish a unique integer which divides incoming electrical pulse 30 in programmable ÷N counter to produce a ÷N pulse as indicated at 38.

Indicator apparatus 33 includes an up/down digital counter 39 having a zero switch 40 which is used to establish a zero setting when the auger 10 is first touched to the gound prior to starting the drilling of hole 22. One of the pulses 29 from the dual pulse signal produced by incremental shaft encoder 28 is supplied to counter 39 as is the ÷N pulse 38. Counter 39 counts the pulses and passes them on for display as a digital output to be displayed on dial or screen 34. The output 41 from digital counter 39 passes into display driver 42 and thence to digital display screen or dial 34. The display circuits are provided with power as indicated at 43 from the auger drilling maching with which it is used.

OPERATION

In operation, the depth measuring system and apparatus is assembled, as indicated, with counter wheel 23 engaging wire or cable 17 and idlers 24 and 25 preventing the cable from jumping off the wheel. As the cable 17 moves to either lower or raise auger 10 into or out of hole 22, rotation of counter wheel 23 measures the movement of cable 17. The circumference of counter wheel 23 is known accurately and one rotation thereof measures the movement of cable 17 equal to the circumference of the counter wheel. The rotation of counter wheel 23 in response to movement of cable 17 is translated by incremental shaft encoder 28 into dual electrical pulses 29 and 30. The dual pulses are processed asynchronously. One of the pulses 30 is processed in programmable counter 35 which is a dividing type counter which is programmable to divide by any selected integer.

Switches 36 and 37 determine the integer in N for division which will adjust the output pulses so that it would be registered in either English or metric units and will be adapted to the particular type and/or model of machine with which the system is being used. The output pulses 38 from counter 35 together with pulse 29 are counted in up/down digital counter 39 and the output processed by display driver 42 and shown as a digital read out on digital display 34. Pulse 29 is a code signal which indicates up or down movement of the kelly bar. The read out on digital display 34 is in feet or meters of depth of the hole 22. Because of the fact that digital counter 39 is an up/down counter, the system is effective for providing a digital display of the depth of the hole or the position of the auger both on upward and downward movement.

AN ALTERNATE EMBODIMENT

Figure 4:
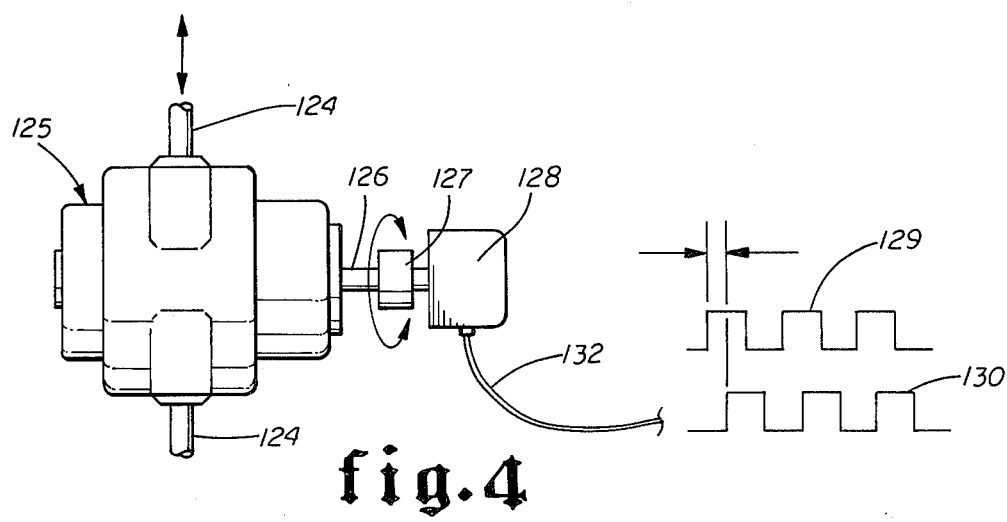
FIG. 4 is a view in elevation of the hydraulic flow meter or hydraulic motor or pump which measures flow of hydraulic fluid in the apparatus of FIG. 3 and the rotary indicator mechanism associated therewith, together with a wave diagram illustrating dual signals produced by this indicator mechanism.

In FIGS. 3 and 4, taken with the electrical diagram shown in FIG. 5, there is illustrated an alternate embodiment of the invention in which the digital depth indicating system is applied to a hydraulic Kelly hoist auger drilling apparratus.

In this embodiment of the invention, auger 110 is supported on the lower end 111 of Kelly bar 112 which passes through a Kelly drive 114. The upper end 115 of Kelly bar 112 is the piston rod for a piston 116 in a hydraulic cylinder 117. Hydraulic cylinder 117 has openings 118 and 119 for introduction of hydraulic fluid for operation of piston 116. Hydraulic fluid is supplied from a reservoir 120 by a pump 121 or other source of hydraulic pressure through valve 122 which directs the flow of fluid either to the upper part of piston 117 through hydraulic line 123 or to the lower part of cyliner 117 through hydraulic line 124.

A hydraulic flow meter 125 is positioned in line 124 leading to or from opening 119 to hydraulic cylinder 117. This flow meter 125 is simply a hydraulic, fixed displacement motor which is rotated once for each predetermined volume of fluid passing to or from hydraulic cylinder 117. Hydraulic flow meter or hydraulic motor 125 has a rotatable shaft 126 which is connected as indicated at 127 to a rotary incremental shaft encoder 128 which functions in the same manner as the shaft encoder 28 of FIG. 1. Rotary shaft encoder 128 is connected by electric leads 132 to digital display assembly 133 having a digital display 134. Shaft encoder 128 produces off set dual pulses 129 and 130 which correspond to the pulses 29 and 30 produced by encoder 28 in FIGS. 1 and 2.

OPERATION

The operation of this embodiment is very similar to that described in connection with the embodiment shown in FIGS. 1 and 2. The hydraulic system to move piston 116 upward or downward in cylinder 117 and thus move Kelly 112 to lower or raise auger 110 in drilling hole 142 in the earth. The amount of movement of piston 116, and the corresponding amount of movement of auger 110, is determined by the amount of hydraulic fluid which flows into or out of hydraulic cylinder 117 through hydraulic line 124 and hydraulic motor or flow meter 125. The rotation of flow meter 125 measures the volume of hydraulic fluid flowing through line 124 and the electric pulses produced in encoder 128 are in proportion to the volume of fluid flowing.

The electric pulses produced by encoder 128 are processed in the digital display assembly in exactly the same manner as was described above for FIG. 5 of the drawings as used with the embodiment shown in FIGS. 1 and 2. In this case, the switch 37 on programmable counter 35, together with switch 36, set the counter to produce output pulses 38 which correspond to either English or metric units and which also correspond to the amount of fluid passed in the hydraulic system registered in terms of the amount of movement of piston 116 and Kelly bar 112. The digital display 34 will therefore register the depth of the hole in terms of the amount of movement of auger 110 by hydraulic piston 116.

While this invention has been fully and completely described with special emphasis upon two preferred embodiments thereof it should be understood that within the scope of the appended claims the invention may be practiced otherwise than as specifically described herein.

I claim:

1. The combination of an earth drilling apparatus having operating means for positively raising and lowering a drill or auger with a digital depth indicating means comprising rotary means, having a rotary shaft, positioned in operating relation to said drill operating means to be rotated thereby, a two-channel incremental shaft encoder cooperable with said rotary shaft and operable to produce dual digital pulses in response to rotation of said shaft, a digital counter operatively connected to said encoder to respond to pulses produced thereby, said counter comprising a digital up/down counter and a programmable $\div N$ counter, each connected to receive pulses from said encoder, said $\div N$ counter including switches to set the same for the type or model of drilling apparatus and for digital display in English or metric units, digital display means operatively connected to said counter to respond to and display the output therefrom in digital units of depth of said drill or auger, and said digital up/down counter being connected to receive $\div N$ pulses from said $\div N$ counter and to said digital display means.

2. A combination according to claim 1 in which said encoder produces dual offset pulses.

3. A combination according to claim 1 in which said digital display means comprises a display driver operated by the output from said up/down counter and a digital display indicator connected to receive the output from said driver.

4. A combination according to claim 1 in which said drill operating means is a wire or cable for raising or lowering said drill or auger, and said rotary means comprises a rotary counter wheel supported in operative engagement with said wire or cable, at least one idler wheel secured to said counter wheel and positioned to maintain said counter wheel in engagement with said wire or cable, said counter wheel having a shaft operatively engaging said encoder to rotate the same therewith.

5. A combination according to claim 4 in which said encoder produces dual offset pulses.

6. A combination according to claim 4 in which said digital display means comprises a display driver operated by the output from said up/down counter and a digital display indicator connected to receive the output from said driver.

7. A combination according to claim 1 in which said drill operating means is a kelly and having hydraulic means for raising and lowering the same into and out of the hole being drilled, and said rotary means comprises a rotary hydraulic motor positioned in the line of flow of hydraulic fluid and rotatably thereby to measure the volume of hydraulic fluid flowing to and from said hydraulic means, and a rotary digital encoder having a shaft operatively connected to said hydraulic motor for rotation thereby.

8. A combination according to claim 7 in which said encoder produces dual offset pulses.

9. A combination according to claim 8 in which said digital display means comprises a display driver operated by the output from said up/down counter and a digital display indicator connected to receive the output from said driver.

* * * * *